(12) United States Patent
Maeda et al.

(10) Patent No.: US 8,389,871 B2
(45) Date of Patent: Mar. 5, 2013

(54) MULTILAYERED WIRING BOARD AND METHOD OF MANUFACTURING THE SAME

(75) Inventors: Shinnosuke Maeda, Nagoya (JP); Satoshi Hirano, Chita-gun (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 147 days.

(21) Appl. No.: 13/034,792

(22) Filed: Feb. 25, 2011

(65) Prior Publication Data

US 2011/0209910 A1 Sep. 1, 2011

(30) Foreign Application Priority Data

Feb. 26, 2010 (JP) .................................. 2010-041470

(51) Int. Cl.
*H05K 1/11* (2006.01)
(52) U.S. Cl. ......................... 174/261; 174/262; 361/767
(58) Field of Classification Search .......... 174/260–262, 174/255–257; 361/760, 767, 771, 777, 795; 29/830, 831, 846, 847, 852
See application file for complete search history.

(56) References Cited

U.S. PATENT DOCUMENTS

| | | | | |
|---|---|---|---|---|
| 2002/0145197 A1* | 10/2002 | Ohta et al. | ..................... | 257/734 |
| 2003/0168249 A1* | 9/2003 | Ito et al. | ......................... | 174/255 |
| 2005/0039948 A1* | 2/2005 | Asai et al. | ...................... | 174/262 |
| 2006/0102384 A1* | 5/2006 | Watanabe et al. | ............. | 174/256 |
| 2006/0270211 A1 | 11/2006 | Nakamura et al. | | |
| 2008/0149384 A1* | 6/2008 | Kawabe | ......................... | 174/265 |
| 2008/0264681 A1* | 10/2008 | Iwai et al. | ..................... | 174/257 |
| 2009/0145635 A1 | 6/2009 | Shimizu | | |
| 2009/0290317 A1* | 11/2009 | Mashino | ....................... | 361/782 |
| 2011/0247208 A1* | 10/2011 | Ikeda et al. | ..................... | 29/830 |

FOREIGN PATENT DOCUMENTS

| | | |
|---|---|---|
| JP | 4146864 | 1/2007 |
| JP | 2009-141121 | 6/2009 |

* cited by examiner

*Primary Examiner* — Hoa C Nguyen
(74) *Attorney, Agent, or Firm* — Stites & Harbison PLLC; Jeffrey A. Haeberlin

(57) ABSTRACT

A multilayered wiring board having a stack structure multilayered by alternately stacking a plurality of conductor layers and a plurality of resin insulation layers, wherein a solder resist is provided on at least one of a first main surface side and a second main surface side of the stack structure, a plurality of openings are formed in an outermost resin insulation layer that contacts with the solder resist, a plurality of the first main surface side connecting terminals or a plurality of the second main surface side connecting terminals being made of a copper layer as a main component and positioned in a plurality of the openings, terminal outer surfaces being positioned inwardly from an outer surface of the outermost resin insulation layer, and the solder resist extends into the plurality of openings and makes contact with an outer circumference portion of each of the terminal outer surfaces.

9 Claims, 8 Drawing Sheets

MULTILAYERED WIRING BOARD AND METHOD OF MANUFACTURING THE SAME

CROSS REFERENCE TO RELATED APPLICATION

The present application claims priority from Japanese Patent Application No. 2010-041470, which was filed on Feb. 26, 2010, the disclosure of which is herein incorporated by reference in its entirety.

BACKGROUND OF THE INVENTION

1. Field of the Invention

The present invention relates to a multilayered wiring board having a stack structure multilayered by alternately stacking a plurality of resin insulation layers including a same resin insulation material as a main component and a plurality of conductor layers and without a so-called core board by sequentially forming build-up layers on both sides of the structure, and a method of manufacturing the same.

2. Description of Related Art

A semiconductor integrated circuit device (IC chip) used as a microprocessor of a computer or the like has recently become more and more rapid and multifunctional. Accordingly, the number of terminals tends to increase, and a pitch between terminals tends to be narrow. Generally, on the bottom face of the IC chip, a plurality of terminals are densely arranged in an array shape, and such a group of terminals are connected to a group of terminals on the motherboard in a flip-chip shape. However, since the pitch between terminals is significantly different between a group of terminals on the IC chip and a group of terminals on the motherboard, it is difficult to directly connect the IC chip onto the motherboard. For this reason, typically, a method is employed in which a semiconductor package is manufactured by mounting the IC chip onto the IC chip mounting wiring board, and the semiconductor package is mounted onto the motherboard.

As the IC chip mounting wiring board for structuring such a kind of package, a multilayered wiring board obtained by forming build-up layers on the front and rear surfaces of the core board is used in practice. In the multilayered wiring board, for example, a resin board (such as a glass epoxy board) obtained by impregnating resin with reinforced fiber is used as a core board. In addition, build-up layers are formed by alternately stacking resin insulation layers and conductor layers on the front and rear surfaces of the core board utilizing the rigidity of the core board. That is, in the multilayered wiring board, the core board has a reinforcing function and is formed to have a significantly larger thickness in comparison with the build-up layer. In addition, the wiring (specifically, a through-hole conductor or the like) for facilitating interconnection between the build-up layers formed on the front and rear surfaces is formed through the core board.

On the other hand, as semiconductor integrated circuit devices have recently become faster and faster, the signal frequency used may become a high frequency band. In this case, the wiring passing through the core board contributes to a large inductance, which is related to the occurrence of high frequency signal transmission loss or circuit malfunction thus hindering high speed operation. In order to address such problems, it has been proposed to design a multilayered wiring board without the core board (e.g., refer to Patent Documents 1 and 2). In this multilayered wiring board described in Patent Documents 1 and 2, the entire wiring length is shortened by omitting the core board which has a relatively large thickness. Therefore, it is possible to reduce high frequency signal transmission loss and operate the semiconductor integrated circuit devices at a high speed.

FIGS. 17 and 18 illustrate specific examples of the wiring boards 100A and 100B disclosed in Patent Document 1. In the wiring boards 100A and 100B, solder resists 104 and 105 are formed on both sides of the insulation layer 103 having a wiring line 101, a via conductor 102, or the like, and an opening 106 for exposing the IC chip connection wiring line 101 is provided in the solder resist 104. In addition, an opening 107 is also formed in the lower side solder resist 105, and a connection terminal 108 to the motherboard or the like is formed inside the opening 107.

In the wiring board 100A of FIG. 17, the connecting terminal 108 is embedded (buried) in the solder resist 105 side, and the connecting terminal 108 and the solder resist 105 having nearly the same thickness. Meanwhile, in the wiring board 100B of FIG. 18, the connecting terminal 108 is embedded (buried) in the insulation layer 103, and the outer circumference portion of the terminal outer surface 108a is covered by the solder resist 105. In addition, in the wiring board of Patent Document 2, the connecting terminal of the IC chip is embedded (buried) in the insulation layer side, and the outer circumference portion of the terminal outer surface is covered by the solder resist.

RELATED ART DOCUMENT

Patent Document

Patent Document 1: Japanese Patent Publication No. 4146864-B (FIG. 1 or 4 or the like).

Patent Document 2: JP-A-2009-141121 (FIG. 7 or the like).

BRIEF SUMMARY OF THE INVENTION

However, in the wiring board 100B of the related art, a two-layered plating layer including a nickel plating layer 109a, a gold plating layer 109b is formed from the inner layer side in the connecting terminal 108 (refer to FIG. 18). When solder 110 is formed on the connecting terminal 108, gold existing in the surface layer side of the connecting terminal 108 diffuses into the melted solder 110 so that a gap is formed between the solder resist 105 and the outer circumference portion of the terminal outer surface 108a (refer to FIG. 19). In this case, the solder resist 105 and the connecting terminal 108 do not abut on each other, thus degrading adherence strength of the connecting terminal 108. In addition, in the wiring board 100A of FIG. 17, only the side surface of the connecting terminal 108 abuts on the solder resist 105, and the terminal outer surface 108a does not make contact with the solder resist 105, so that it is difficult to obtain sufficient adherence strength in the connecting terminal 108. Therefore, in this case, it is difficult to obtain wiring boards 100A and 100B having a high reliability.

Furthermore, in the wiring boards 100A and 100B shown in FIGS. 17 and 18, the wiring line 101 is formed on the insulation layer 103 and protruded from the upper surface of the insulation layer 103. In other words, in the wiring boards 100A and 100B, each wiring line 101 is formed to be buried in the upper side solder resist 104. For example, when the solder resist 104 is formed to contain a cured material of a resin insulation material having photo-curability as a main (primary) characteristic, the solder resist 104 typically has a lower insulation property in comparison with the inner insulation layer 103. Therefore, when the wiring line 101 is provided to be protruded in the solder resist 104 side as in the wiring lines 100A and 100B, it may be difficult to obtain an insulation property between the wiring lines 101 due to a high density tendency of the wiring lines 101. In addition, this also causes reduced reliability.

The present invention has been made to address the aforementioned problems, and provides a multilayered wiring board with high reliability capable of sufficiently increasing adherence strength of the connecting terminal. In addition, the present invention also provides a multilayered wiring board capable of obtaining an insulation property between the connecting terminals, and a method of manufacturing the same.

According to a first illustrative aspect to address the aforementioned problems, there is provided a multilayered wiring board having a stack structure multilayered by alternately stacking a plurality of conductor layers and a plurality of resin insulation layers including a same resin insulation material as a primary (main) component, a plurality of first main surface side connecting terminals arranged in a first main surface side of the stack structure, a plurality of second main surface side connecting terminals arranged in a second main surface side of the stack structure, the plurality of conductor layers formed in the plurality of resin insulation layers and operably connected to each other through via conductors tapered such that diameters thereof are widened toward the first main surface side or the second main surface side, wherein a solder resist is provided (positioned or located) on at least one of the first main surface side and the second main surface side of the stack structure, a plurality of openings are formed in an outermost resin insulation layer that contacts with the solder resist, a plurality of the first main surface side connecting terminals or a plurality of the second main surface side connecting terminals being made of a copper layer as a main component and positioned in a plurality of the openings, terminal outer surfaces being positioned inwardly from an outer surface of the outermost resin insulation layer, and the solder resist extends into the plurality of openings and makes contact with an outer circumference portion of each of the terminal outer surfaces.

According to the invention described in the first aspect, there is formed a multilayered wiring board as a coreless wiring board which does not have the core board by alternately stacking a plurality of resin insulation layers and a plurality of conductor layers containing the same resin insulation material as a primary or main component. In this multilayered wiring board, a plurality of first main surface side connecting terminals or a plurality of second main surface side connecting terminals are positioned in the openings formed in the outermost resin insulation layer, and the terminal outer surfaces of the connecting terminals are positioned inwardly from the surface of the outermost resin insulation layer. In addition, the solder resist extends into the opening formed in the outermost resin insulation layer and makes contact with the outer circumference portion of each of the terminal outer surfaces so that the outer circumference portion of the terminal outer surface is pressed toward a so-called board thickness direction. Therefore, the connecting terminal is reliably fixed to the outermost resin insulation layer, a gap is not generated between the solder resist and the outer circumference portion of the terminal outer surface, and it is possible to sufficiently increase the adherence strength of the connecting terminal. In addition, since the adherence area of the solder resist for the terminal outer side or the resin insulation layer increases, it is possible to increase the strength of the multilayered wiring board. In addition, since the terminal outer surface of the connecting terminal is not protruded to the solder resist side but buried in the resin insulation layer having a high insulation property, it is possible to sufficiently obtain insulation between the connecting terminals.

In one implementation, the terminal outer surface is formed with a concavely rounded portion so that the center portion is positioned inwardly from the outer circumference portion. If the connecting terminal is formed in this manner, the adherence area of the solder resist increases. Therefore, it is possible to sufficiently increase adherence with the solder resist. In addition, since the outer circumference portion of the terminal outer side making contact with the solder resist becomes thick, it is possible to improve strength of the terminal.

In another implementation, the conductor layer, which is located or existing at the interface between the solder resist and the outermost resin insulation layer, includes an interface conductor portion which is embedded in the outermost resin insulation layer. In this manner, the resin insulation layer having a high insulation property is interposed between the conductor layers such as the wiring pattern, and each wiring line can be prepared with a relatively narrow pitch. Therefore, the multilayered wiring board can be highly integrated. Here, as a conductor layer existing at the interface between the solder resist and the outermost resin insulation layer, the multilayered wiring board of the first aspect may include a wiring pattern conductor portion adjacent to the plurality of first main surface side connecting terminals or the plurality of second main surface side connecting terminals. In this case, the outermost resin insulation layer between the plurality of first main surface side connecting terminals or the plurality of second main surface side connecting terminals and the wiring pattern conductor portion may protrude into the solder resist side further than the plurality of first main surface side connecting terminals or the plurality of second main surface side connecting terminals and the wiring pattern conductor portion. If the outermost resin insulation layer protrudes in this manner, since the insulation length between the connecting terminal and the wiring pattern conductor portion increases, it is possible to suppress generation of migration therebetween.

In yet another implementation, a diameter of openings provided in the solder resist is smaller than a diameter of the openings provided in the outermost resin insulation layer, and the center portion of the terminal outer surface arranged in the opening of the solder resist is formed with a coat metal layer (e.g., a plating layer) made of one or more kinds of metal other than copper. In this case, the coat metal layer does not exist at the interface between the solder resist and the outer circumference portion on the terminal outer surface exposed out of the opening of the solder resist. Here, if, for example, a nickel-gold plating layer is used as the coat metal layer, gold is diffused to the melted solder during the soldering connection. However, according to the present invention, there is no gold plating at the interface between the terminal outer surface and the solder resist. Therefore, it is possible to address a problem that a gap is formed at the interface between the terminal outer surface and the solder resist due to diffusion of gold to the solder. As a result, it is possible to allow the terminal outer surface and the solder resist to reliably abut on each other, and sufficiently obtain adherence strength of the connecting terminal even after forming the solder on the connecting terminal.

In still yet another implementation, the solder resist is arranged on the second main surface side of the stack structure, and a plurality of motherboard connecting terminals to be connected to a motherboard are the plurality of second main surface side connecting terminals. In this case, the motherboard connecting terminals require a relatively large area and high adherence strength. However, since the solder resist is inserted into the opening as described above, the outer circumference portion of the terminal outer surfaces are pressed toward a so-called board thickness direction. Therefore, it is possible to obtain sufficient adherence strength in the motherboard connecting terminals and improve reliability of the multilayered wiring board. In addition, the solder resist may be provided on the main surface side where the motherboard is connected or on the opposite side to the main surface, for example, in the main surface side where the IC chip is installed.

In still yet another implementation, the via conductors are tapered such that the diameters thereof are widened from the second main surface side to the first main surface side. Inversely, all of the via conductors formed in a plurality of resin insulation layers may be tapered such that the diameters thereof are widened from the first main surface side to the second main surface side. In this manner, it is possible to reliably manufacture the coreless wiring board without the core board.

According to a second illustrative aspect to address the aforementioned problems, there is provided a method of manufacturing a multilayered wiring board having a stack structure multilayered by alternately stacking a plurality of conductor layers and a plurality of resin insulation layers including a same resin insulation material as a main component, a plurality of first main surface side connecting terminals being arranged in a first main surface side of the stack structure, a plurality of second main surface side connecting terminals being arranged in a second main surface side of the stack structure, the plurality of conductor layers being formed in the plurality of resin insulation layers and operably connected to each other through via conductors tapered such that diameters thereof are widened toward the first main surface side or the second main surface side, the method including: a process of forming a metal conductor portion corresponding to the first main surface side connecting terminal or the second main surface side connecting terminal on a base material; a build-up process of forming, after the process of forming the metal conductor portion, a stack structure multilayered by alternately stacking a plurality of conductor layers and a plurality of resin insulation layers; a process of forming, after the build-up process, connecting terminals including a plurality of the first main surface side connecting terminals and a plurality of the second main surface side connecting terminals within a plurality of openings in an outermost resin insulation layer by removing the base material except for a part of the metal conductor portion; and a process of forming, after the process of forming the connecting terminals, a solder resist on the outermost resin insulation layer, a part of the solder resist extending into the plurality of the openings and making contact with an outer circumference portion of the outer surfaces of the connecting terminals.

Therefore, according to the invention described in the second aspect, a plurality of the first main surface side connecting terminals or a plurality of the second main surface side connecting terminals are positioned or buried in a plurality of openings formed in the outermost resin insulation layer, and each connecting terminal is formed such that the terminal outer surface is positioned inwardly from the outer surface of the outermost resin insulation layer. In addition, by performing the process of forming the solder resist, the solder resist extends into the opening formed in the outermost resin insulation layer and makes contact with the outer circumference portion of the terminal outer surface so that the outer circumference portion of the terminal outer surface is pressed from a so-called board thickness direction. Therefore, the connecting terminal is reliably fixed to the outermost resin insulation layer, a gap is not generated between the solder resist and the outer circumference portion of the terminal outer surface, and it is possible to sufficiently increase the adherence strength of the connecting terminal. In the multilayered wiring board obtained in this manner, since the adherence surface of the solder resist for the outer surface of the connecting terminal or the resin insulation layer increases, it is possible to increase its strength. In addition, the terminal outer surface of the connecting terminal is not protruded to the solder resist side and is embedded or buried in the resin insulation layer having a high insulation property. Therefore, it is possible to sufficiently obtain an insulation property between connecting terminals.

In accordance with one implementation, in the process of forming the metal conductor portion, a metal foil is stacked in a removable state on the base material, and the metal conductor portion is formed on the metal foil. In this case, a process of removing the base material to expose the metal foil is performed after the build-up process, and a plurality of first main surface side connecting terminals or a plurality of second main surface side connecting terminals are formed by etching and removing the metal foil in the stack structure. In this manner, it is possible to reliably form the plurality of the first main surface side connecting terminals or the plurality of the second main surface side connecting terminals such that they are positioned or buried in the plurality of openings formed in the outermost resin insulation layer, and the terminal outer surfaces are positioned inwardly from the outer surface of the outermost resin insulation layer.

Preferable examples of the polymer material for forming a plurality of the resin insulation layers include thermosetting resin such as epoxy resin, phenol resin, urethane resin, silicon resin, and polyimide resin, or thermoplastic resin such as polycarbonate resin, acrylic resin, polyacetyl resin, polypropylene resin, and the like. In addition, a composite material with resin and organic fiber such as glass fiber (glass woven fabrics or glass non-woven fabrics) or polyamide fiber, or a resin composite material obtained by impregnating thermosetting resin such as epoxy resin in a fluorine-based resin material having a 3-dimetional mesh shape such as a continuous porous PTFE may be used. In addition, according to the present invention, "a plurality of resin insulation layers made of the same resin insulation material as a main component" means that the materials corresponding to a specific example are identical if the thermosetting resin as a main component is identical even when the additive such as glass fiber impregnated into the thermosetting resin is different. In addition, the "solder resist" refers to a heat-resistant coat material serving as a dam resistant to the solder flow during soldering.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
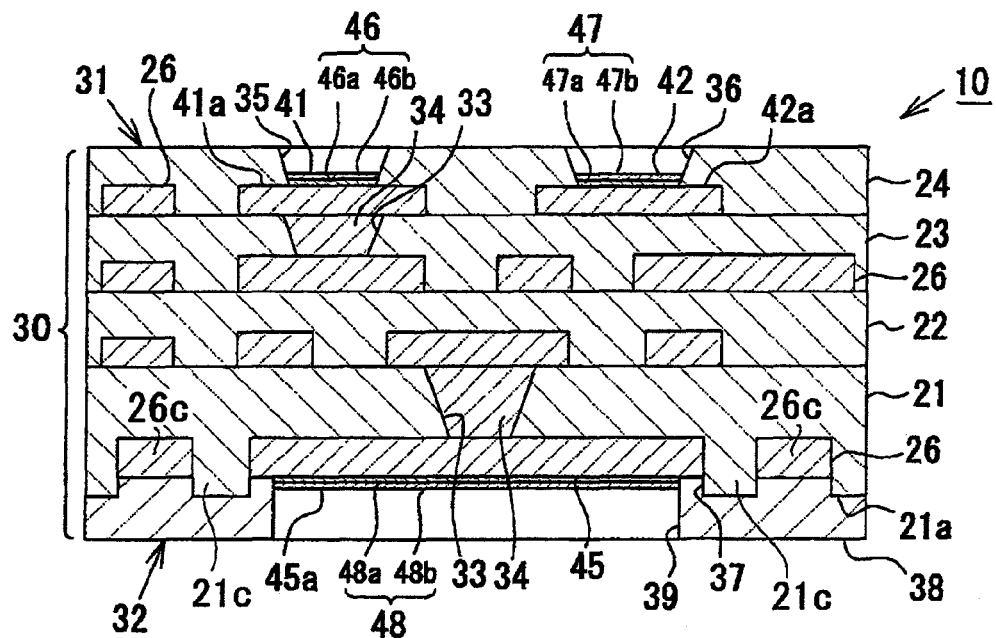
FIG. 1 is an enlarged cross-sectional view illustrating a schematic configuration of a multilayered wiring board according to an embodiment.

Hereinafter, a multilayered wiring board according to an embodiment of the present invention will be described in detail with reference to the accompanying drawings. FIG. 1 is an enlarged cross-sectional view illustrating a schematic configuration of the multilayered wiring board according to the present embodiment. In addition, FIG. 2 is a plan view illustrating the multilayered wiring board viewed from the upper surface side, and FIG. 3 is a plan view illustrating the multilayered wiring board viewed from the bottom surface side.

Referring to FIG. 1, the multilayered wiring board 10 is a coreless wiring board which does not have the core board but has a wiring stack portion 30 (stack structure) multilayered by alternately stacking four resin insulation layers 21, 22, 23 and 24 including a same resin insulation material as a main component and a conductor layer 26 made of copper. Each resin insulation layer 21 to 24 is formed using a build-up material including a resin insulation material that does not yield photo-curability, specifically, a cured material of thermosetting epoxy resin as a main component. In the multilayered wiring board 10, a plurality of connecting terminals 41 and 42 (first main surface side connecting terminals) are arranged on the upper surface 31 (first main surface) side of the wiring stack portion 30.

Figure 2:
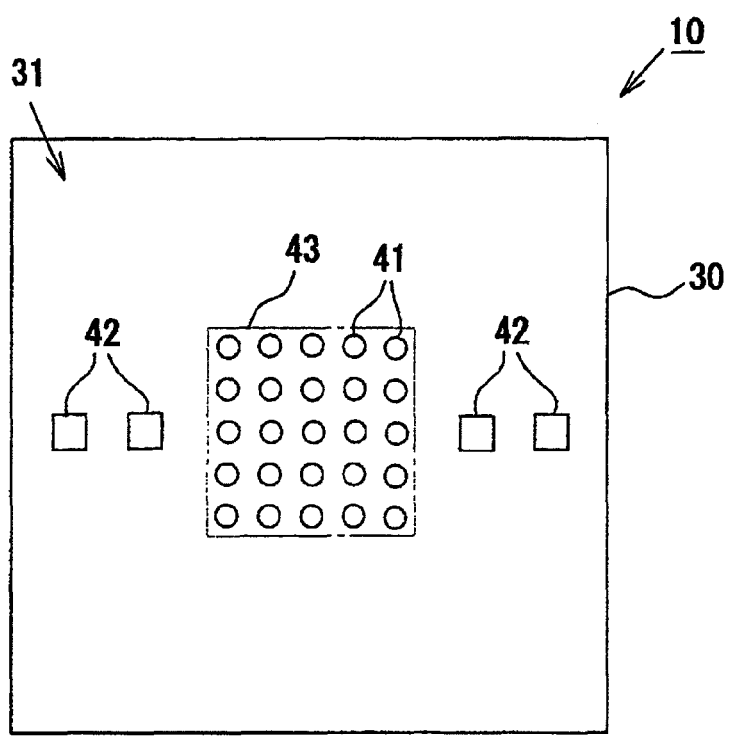
FIG. 2 is a plan view illustrating a schematic configuration of the multilayered wiring board.

As shown in FIGS. 1 and 2, in the multilayered wiring board 10 of the present embodiment, as a plurality of connecting terminals 41 and 42 arranged in the upper surface 31 side of the wiring stack portion 30, there are an IC chip connecting terminal 41 to be connected to the IC chip and a condenser connecting terminal 42 to be connected to the chip condenser. In the upper surface 31 side of the wiring stack portion 30, a plurality of IC chip connecting terminals 41 are arranged in an array shape in the chip mounting area 43 provided in the board center portion. In addition, the condenser connecting terminal 42 has a larger area than that of the IC chip connecting terminal 41 and is arranged in the outer circumference side from the chip mounting area 43.

Figure 3:
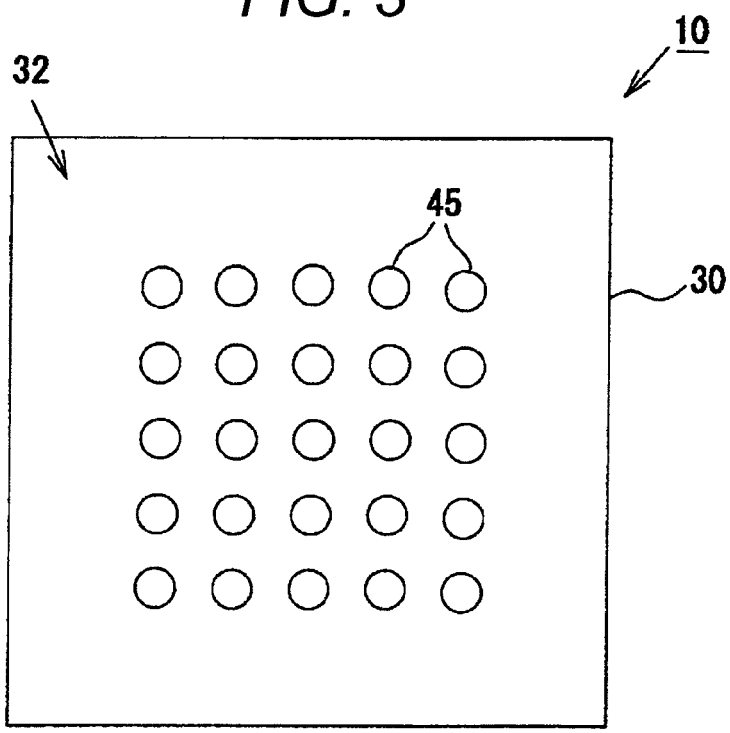
FIG. 3 is a plan view illustrating a schematic configuration of the multilayered wiring board.

On the other hand, as shown in FIGS. 1 and 3, in the lower surface 32 (second main surface) side of the wiring stack portion 30, a plurality of connecting terminals 45 (motherboard connecting terminals as the second surface side connecting terminal) used for a land grid area (LGA) to be connected to the motherboard are arranged in an array shape. The motherboard connecting terminal 45 has a larger area than those of the condenser connecting terminal 42 and the IC chip connecting terminal 41 provided in the upper surface 31 side.

Each of the resin insulation layers 21, 22, 23 and 24 is provided with a via hole 33 and a filled via conductor 34. All of the via conductors 34 have a tapered shape in the same direction (in FIG. 1, a diameter is widened from the lower surface side to the upper surface side), and electrically connect each conductor layer 26, the IC chip connecting terminal 41, the condenser connecting terminal 42, and the motherboard connecting terminal 45 to each other.

In the upper surface 31 side of the wiring stack portion 30, the exposed outermost resin insulation layer 24 is provided with a plurality of openings 35 and 36, and the IC chip connecting terminal 41 and the condenser connecting terminal 42 are arranged to match with the openings 35 and 36. Specifically, the IC chip connecting terminal 41 is formed within the opening 35 in a state where the height of the terminal outer surface 41a of IC chip connecting terminal 41 is lower than the height of the surface of the resin insulation layer 24. The outer circumference portion of the terminal outer surface 41a is covered by the outermost resin insulation layer 24. That is, the IC chip connecting terminal 41 is larger than the opening 35, and the outer circumference portion of the terminal outer surface 41a is embedded or buried in the resin insulation layer 24.

In addition, the condenser connecting terminal 42 is arranged inside the opening 36 in a state where the height of the terminal outer surface 42a is lower than the height of the surface of the resin insulation layer 24, and the outer circumference portion of the terminal outer surface 42a is covered by the outermost resin insulation layer 24. That is, the condenser connecting terminal 42 is larger than the opening 36, and the outer circumference portion of the terminal outer surface 42a is embedded or buried in the resin insulation layer 24. The IC chip connecting terminal 41 and the condenser connecting terminal 42 are formed of a copper layer as a main component. In addition, the IC chip connecting terminal 41 and the condenser connecting terminal 42 has a structure in which only the upper surface of the copper layer exposed in the openings 35 and 36 is covered by the plating layers 46 and 47 made of a material other than copper (specifically, the nickel plating layers 46a and 47a and the gold plating layers 46a and 47b).

In the lower surface 32 side of the wiring stack portion 30, a plurality of openings 37 are formed in the outermost resin insulation layer 21, and the motherboard connecting terminal 45 is arranged to match with a plurality of the openings 37. Specifically, the motherboard connecting terminal 45 is disposed in the opening 37 in a state where the terminal outer surface 45a is positioned inwardly from the surface 21a of the resin insulation layer 21. The motherboard connecting terminal 45 is made of a copper layer as a primary or main component and has the same diameter as that of the opening 37.

In addition, in the lower surface 32 side of the wiring stack portion 30, almost the entire surface of the outermost resin insulation layer 21 is covered by the solder resist 38, and the solder resist 38 is formed with an opening 39 for exposing the motherboard connecting terminal 45. The solder resist 38 is made of a cured material of a resin material having photo-curability as a primary or main characteristic and extends into a plurality of openings 37 formed in the resin insulation layer 21 to make contact with the outer circumference portion of the terminal outer surface 45a of the motherboard connecting terminal 45. That is, the solder resist 38 abuts on the surface 21a of the resin insulation layer 21 and the outer circumference portion of the terminal outer surface 45a. In addition, according to the present embodiment, the solder resist 38 extends into the outermost resin insulating layer 21 as deep as 3 μm to 10 μm.

The opening 39 provided in the solder resist 38 has a diameter slightly smaller than that of the opening 37 provided in the resin insulation layer 21. A plating layer 48 (specifically, a coat metal layer including a nickel plating layer 48a and a gold plating layer 48b) made of metal other than copper is formed in the center portion (the exposed portion of the motherboard connecting terminal 45) on the terminal outer surface 45a arranged in the opening 39. In addition, the motherboard is connected using solder (not shown) to the motherboard connecting terminal 45.

In addition, in the multilayer wiring board 10, the plurality of conductor layers 26 include an interface conductor layer (the wiring pattern conductor portion 26c) for forming the wiring pattern in addition to the motherboard connecting terminal 45 is formed in the interface between the resin insulation layer 21 and the solder resist 38. Similarly to the motherboard connecting terminal 45, this conductor layer 26 is embedded or buried in the resin insulation layer 21 and is not protruded into the solder resist 38. A protrusion 21c is interposed between the motherboard connecting terminal 45 and the wiring pattern conductor portion 26c adjacent to the motherboard connecting terminal 45. The protrusion 21c as a part of the outermost resin insulation layer 21 is protruded into the solder resist 38 further than the motherboard connecting terminal 45 and the wiring pattern conductor portion 26c.

The multilayered wiring board 10 having the aforementioned structure is manufactured, for example, through the following sequence.

First, in a build-up process, a support board having sufficient strength (such as a glass epoxy board) is prepared, and a wiring stack portion 30 is formed by building up the resin insulation layers 21 to 24 and the conductor layer 26 on the support board.

Figure 4:
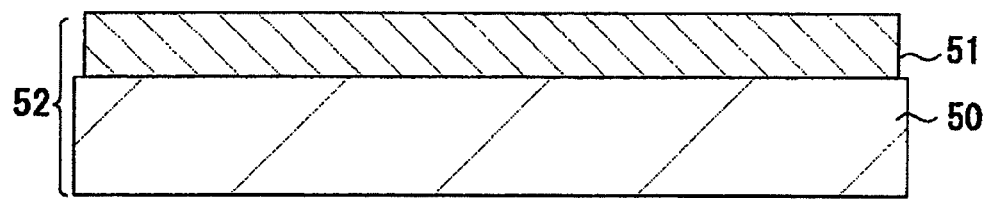
FIG. 4 is an explanatory diagram illustrating a method of manufacturing the multilayered wiring board.
Figure 5:
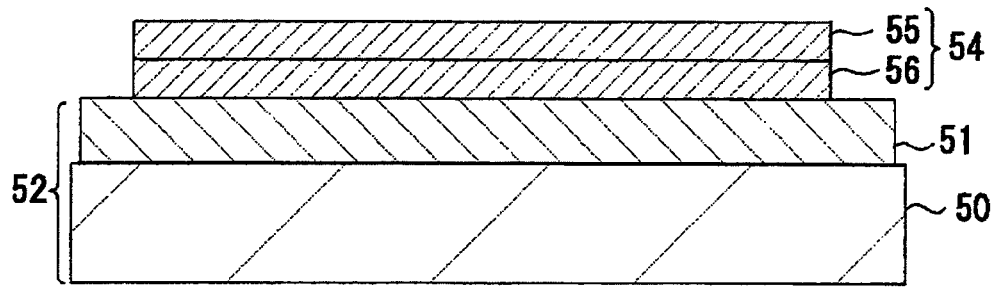
FIG. 5 is an explanatory diagram illustrating a method of manufacturing the multilayered wiring board.

Specifically, as shown in FIG. 4, a base material 52 including the support board 50 and the underlying resin insulation layer 51 is obtained by forming the underlying resin insulation layer 51 by adhering an insulation resin base material having a sheet shape and made of epoxy resin on the support board 50. As shown in FIG. 5, a stack metal sheet body 54 is arranged on an upper surface of the underlying resin insulation layer 51 of the base material 52. Here, adherence is reliably obtained such that the stack metal sheet body 54 is not separated from the underlying resin insulation layer 51 in the subsequent manufacturing process by arranging the stack metal sheet body 54 on the underlying resin insulation layer 51. The stack metal sheet body 54 includes two copper foils 55 and 56 (a pair of metal foils) adhered in a removable state. Specifically, the stack metal sheet body 54 is formed by arranging the copper foils 55 and 56 using the metal plating (such as chrome plating, nickel plating, titanium plating, or a combination of them).

Figure 6:
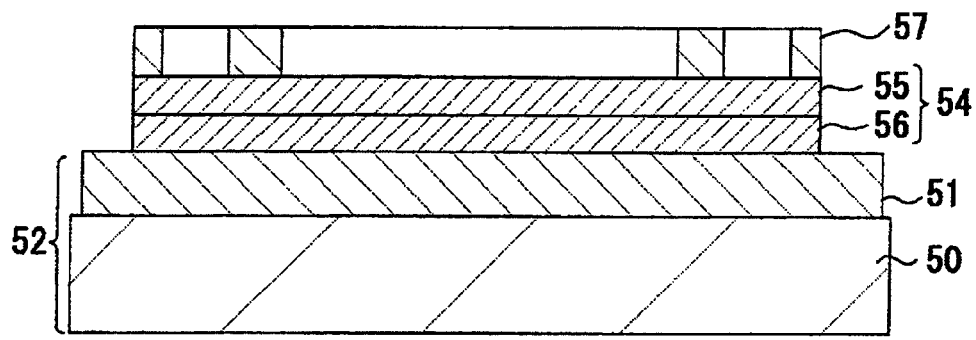
FIG. 6 is an explanatory diagram illustrating a method of manufacturing the multilayered wiring board.
Figure 7:
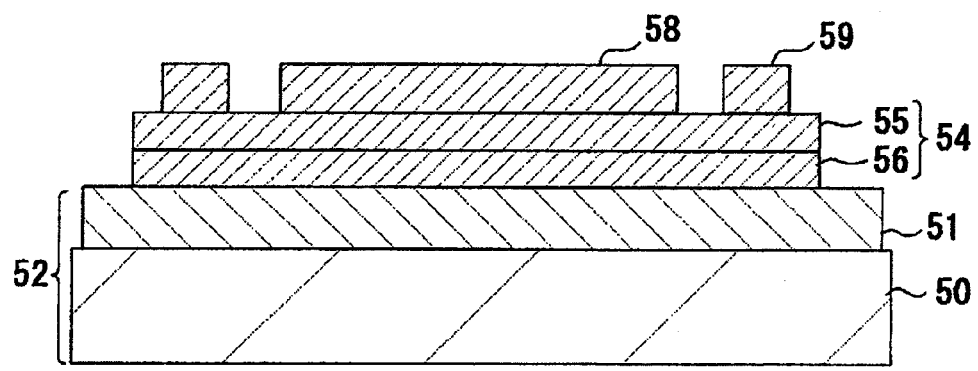
FIG. 7 is an explanatory diagram illustrating a method of manufacturing the multilayered wiring board.

Then, the metal conductor portion to be used as the motherboard connecting terminal 45 or the metal conductor portion to be used as the conductor layer 26 is formed on the stack metal sheet body 54 (a process of forming the metal conductor portion). Specifically, a dry film for forming the plating resist is laminated on the upper surface of the stack metal sheet body 54, and the dry film is exposed and developed. As a result, a plating resist 57 having a predetermined pattern having openings in the portions corresponding to the motherboard connecting terminal 45 or the conductor layer 26 is formed (refer to FIG. 6). In addition, electro copper plating is selectively performed in a state while the plating resist 57 is formed, the metal conductor portions 58 and 59 are formed on the stack metal sheet body 54, and then, the plating resist 57 is exfoliated (refer to FIG. 7).

Figure 8:
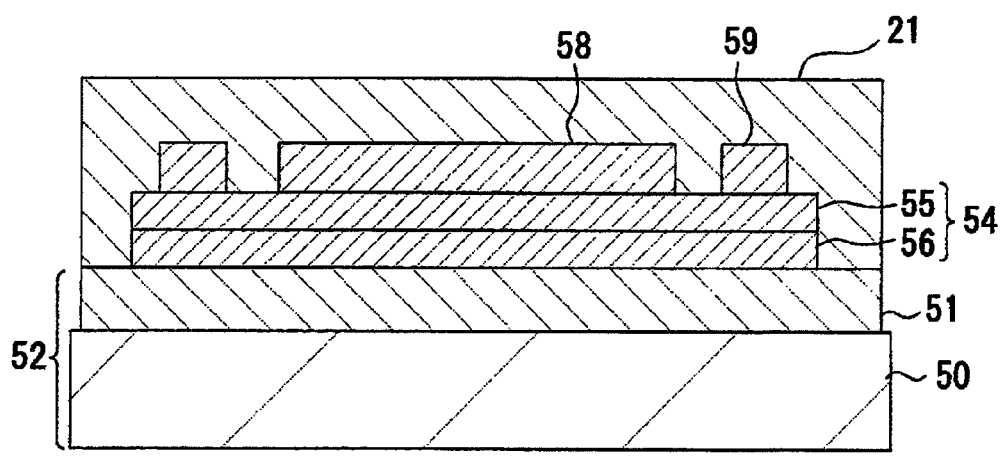
FIG. 8 is an explanatory diagram illustrating a method of manufacturing the multilayered wiring board.

After the process of forming the metal conductor portions 58 and 59, the surfaces of the metal conductor portions 58 and 59 are roughened (CZ treatment) in order to increase adherence with the resin insulation layer. Then, the resin insulation layer 21 having a sheet shape is arranged to envelope the stack metal sheet body 54 where the metal conductor portions 58 and 59 are formed, and the resin insulation layer 21 is bonded (refer to FIG. 8). Here, the resin insulation layer 21 abuts on the stack metal sheet body 54 and the metal conductor portions 58 and 59, and at the same time, abuts on the underlying resin insulation layer 51 around the stack metal sheet body 54, so that the stack metal sheet body 54 is sealed.

Figure 9:
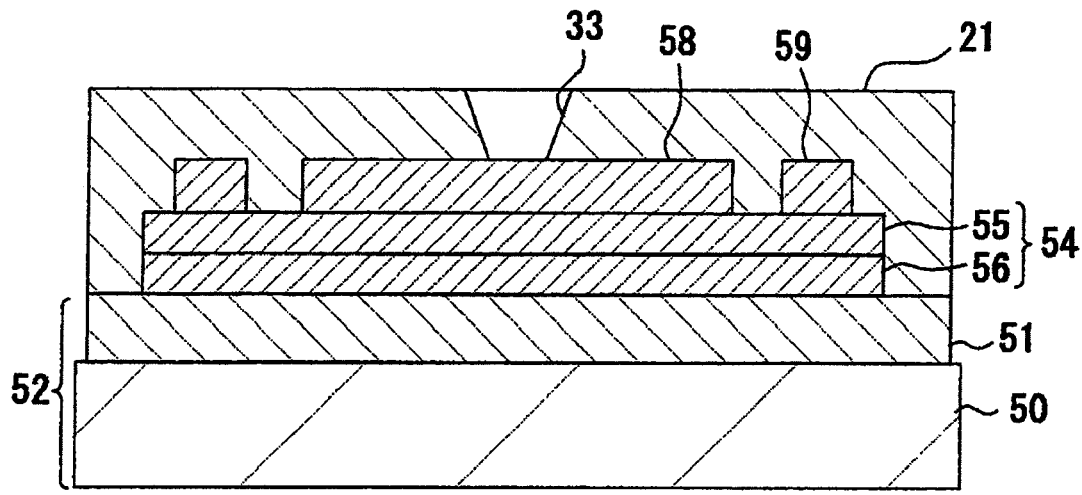
FIG. 9 is an explanatory diagram illustrating a method of manufacturing the multilayered wiring board.

In addition, as shown in FIG. 9, a via hole 33 is formed in a predetermined position (in the position over the metal conductor portion 58) of the resin insulation layer 21 by performing a laser process, for example, using excimer laser, UV laser, $CO_2$ laser, or the like. Then, a de-smear process for removing the smear within each via hole 33 is performed using an etching solution such as a potassium permanganate solution. In addition, as a de-smear process, a plasma ashing process, for example, using $O_2$ may be performed in addition to the process using the etching solution.

Figure 10:
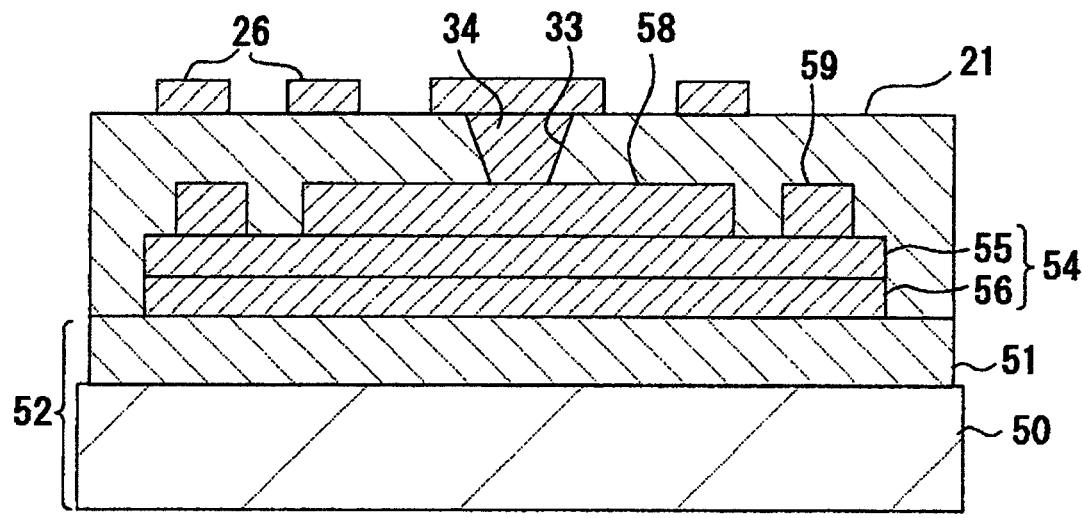
FIG. 10 is an explanatory diagram illustrating a method of manufacturing the multilayered wiring board.

After the de-smear process, a via conductor 34 is formed within each via hole 33 by performing electroless copper plating and electro copper plating according to a technique known in the related art. In addition, a pattern of the conductor layer 26 is formed on the resin insulation layer 21 by performing etching using a technique known in the related art, such as a semi-additive method (refer to FIG. 10).

Figure 11:
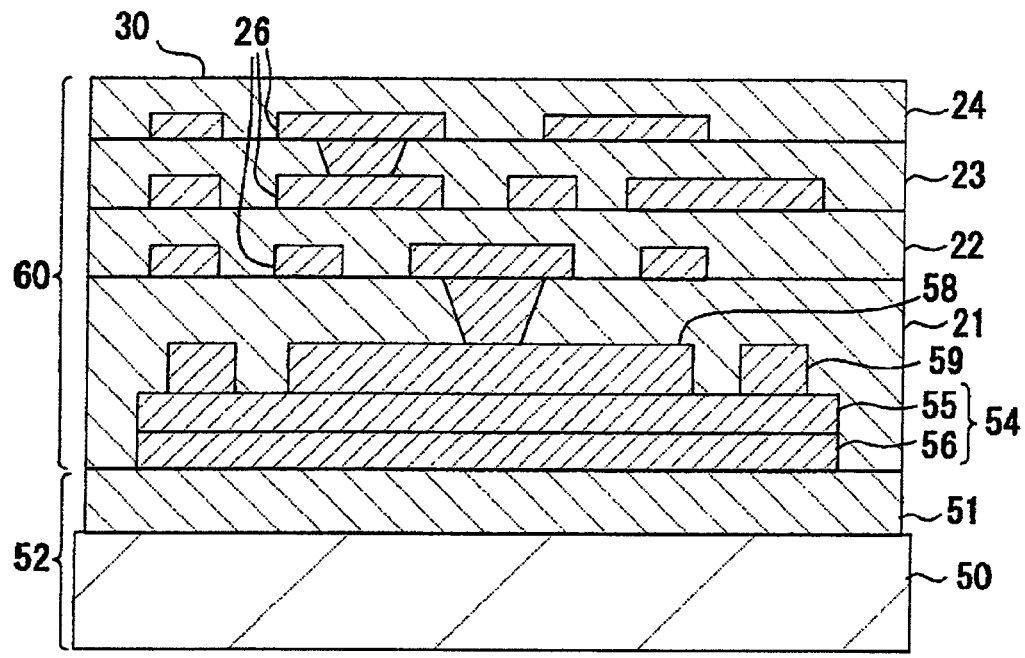
FIG. 11 is an explanatory diagram illustrating a method of manufacturing the multilayered wiring board.

In addition, the second to fourth resin insulation layers 22 to 24 and the conductor layers 26 may be formed using a method similar to those of the aforementioned first resin insulation layer 21 and the conductor layers 26 and stacked on the resin insulation layer 21. Through the aforementioned build-up process, the wiring stack body 60 is formed by stacking the stack metal sheet body 54, the resin insulation layers 21 to 24, and the conductor layers 26 (refer to FIG. 11) on the base material 52. In addition, the area positioned on the stack metal sheet body 54 in the wiring stack body 60 corresponds to the wiring stack portion 30 of the multilayered wiring board 10.

Figure 12:
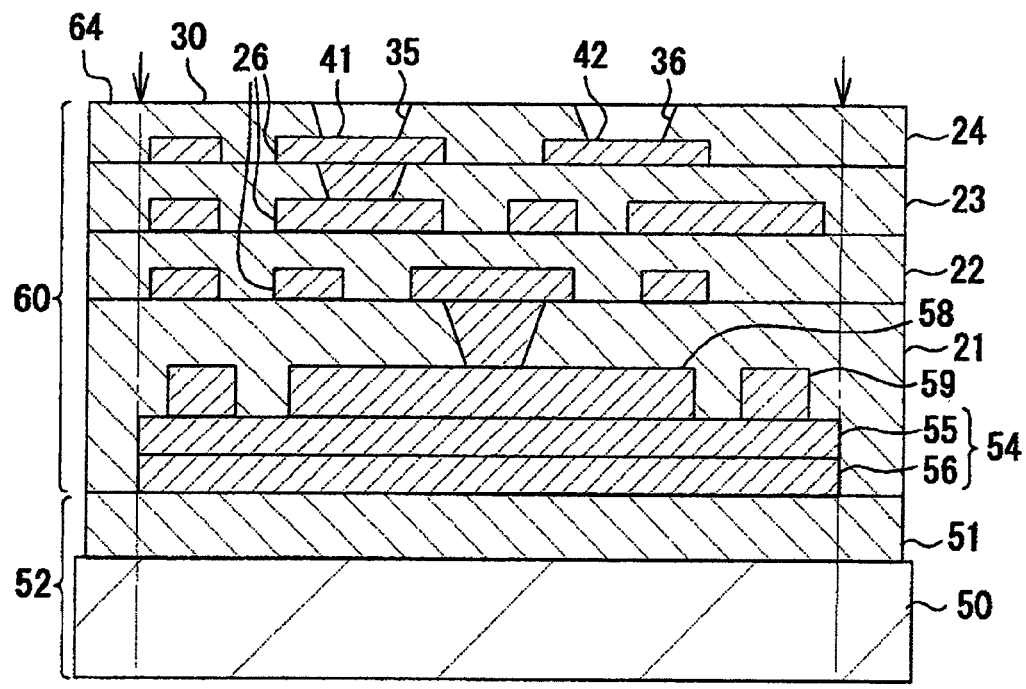
FIG. 12 is an explanatory diagram illustrating a method of manufacturing the multilayered wiring board.

In addition, a plurality of openings 35 and 36 are formed by performing laser hole machining for the outermost resin insulation layer 24 (refer to FIG. 12). Then, a de-smear process for removing the smear within each opening 35 and 36 is performed using a potassium permanganate solution or $O_2$ plasma. Here, in the wiring stack body 60, a part of the conductor layer 26 exposed by a plurality of openings 35 corresponds to the IC chip connecting terminal 41, and a part of the conductor layer 26 exposed by a plurality of openings 36 corresponds to the condenser connecting terminal 42.

After the de-smear process, the motherboard connecting terminal 45 and the conductor layer 26 are formed in a plurality of openings 37 of the outermost resin insulation layer 21 by removing the base material 52 except for a part of the metal conductor portions 58 and 59 (a process of forming the connecting terminal). In the process of forming the connecting terminal, first, the wiring stack body 60 is cut using a dicing apparatus (not shown), and an area around the wiring stack body 30 is removed. In this case, as shown in FIG. 12, in the wiring stack body 30 and the boundary with the circumference portion 64 thereof (the boundary shown as an arrow in FIG. 12), the cutting is performed for each base material 52 under the wiring stack body 30 (the support board 50 and the underlying resin insulation layer 51). As a result of the cutting, the outer edge portion of the stack metal sheet body 54 sealed by the resin insulation layer 21 is exposed. That is, by removing the circumference portion 64, the adhering portion between the underlying resin insulation layer 51 and the resin insulation layer 21 is removed. As a result, the wiring stack portion 30 and the base material 52 are connected only through the stack metal sheet body 54.

Figure 13:
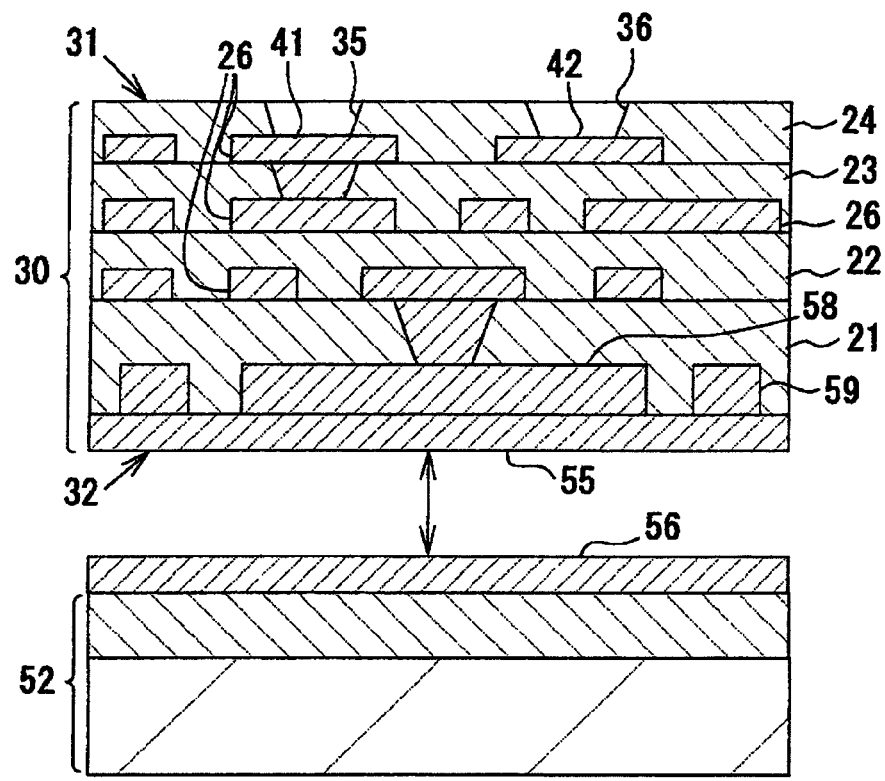
FIG. 13 is an explanatory diagram illustrating a method of manufacturing the multilayered wiring board.

Here, as shown in FIG. 13, the base material 52 is removed from the wiring stack portion 30 by exfoliating the boundary of a pair of the copper foils 55 and 56 of the stack metal sheet body 54 to expose the copper foil 55 provided in the lower surface 32 of the wiring stack portion 30 (the resin insulation layer 21) (a process of removing the base material).

Figure 14:
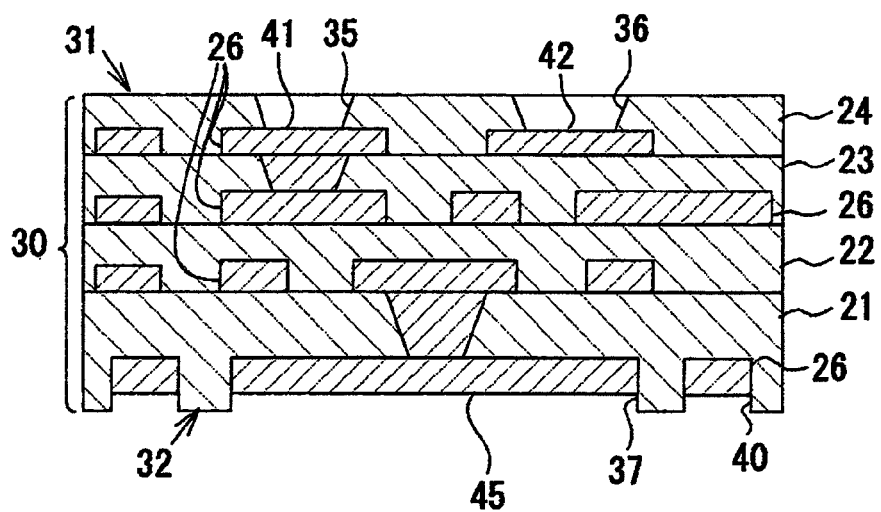
FIG. 14 is an explanatory diagram illustrating a method of manufacturing the multilayered wiring board.

Then, the motherboard connecting terminal 45 or the conductor layer 26 is formed by etching and removing a part of the copper foil 55 and the metal conductor portions 58 and 59 exposed in the lower surface 32 side of the wiring stack portion 30. Specifically, a dry film for forming the etching resist is laminated on the upper surface 31 of the wiring stack portion 30, and the etching resist which covers the entire upper surface 31 is formed by exposing and developing the dry film. In this state, the copper foil 55 is entirely removed by etching the wiring stack portion 30, and a part of the metal conductor portion 58 and 59 is removed at the same time. As a result, as shown in FIG. 14, the opening 37 is formed in the resin insulation layer 21, and the metal conductor portion 58 remaining in the opening 37 becomes the motherboard connecting terminal 45. In addition, the opening 40 is formed in the resin insulation layer 21, and a part of the metal conductor portion 59 remaining in the opening 40 becomes the conductor layer 26 of the wiring pattern.

Figure 15:
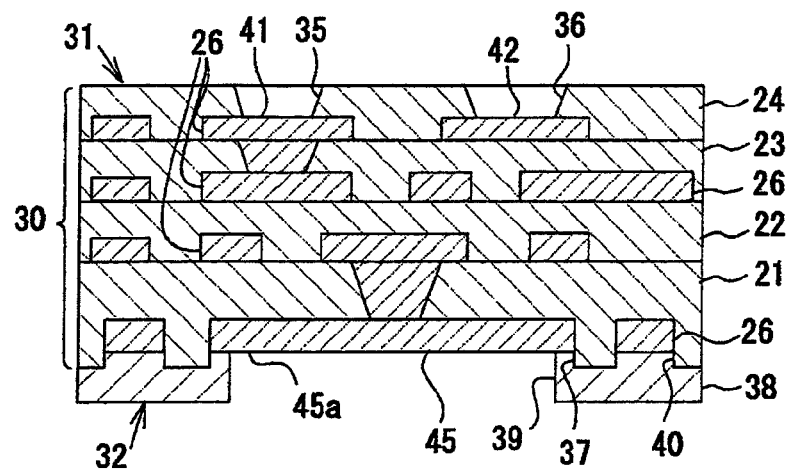
FIG. 15 is an explanatory diagram illustrating a method of manufacturing the multilayered wiring board.

After the process of forming the connecting terminal, the solder resist 38 is formed by coating and curing photosensitive epoxy resin on the resin insulation layer 21 (a process of forming the solder resist). In this case, a part of the solder resist 38 extends into a plurality of openings 37 and 40 and makes contact with the terminal outer surface 45a of the motherboard connecting terminal 45 and the surface of the conductor layer 26. Then, exposure and developing is performed in a state where a predetermined mask is arranged, and the opening 39 is patterned in the solder resist 38 (refer to FIG. 15). As a result, the center portion in the terminal outer surface 45a of the motherboard connecting terminal 45 is exposed by the opening 39 of the solder resist 38. In addition, the surface of the conductor layer 26 is covered by the solder resist 38.

Then, electroless nickel plating and electroless gold plating are sequentially performed for the surface of the IC chip connecting terminal 41 exposed by the opening 35, the surface of the condenser connecting terminal 42 exposed by the opening 36, and the surface of the motherboard connecting terminal 45 exposed by the opening 39. As a result, the plating layers 46, 47, and 48 including the nickel plating layers 46a, 47a, and 48a and the gold plating layers 46b, 47b, and 48b are formed. Through the aforementioned processes, the multilayered wiring board 10 of FIG. 1 is manufactured.

Therefore, according to the present embodiment, the following effects can be obtained.

(1) In the multilayered wiring board 10 according to the present embodiment, the motherboard connecting terminal 45 is embedded or buried in the opening 37 formed in the outermost resin insulation layer 21, and the terminal outer surface 45a of the motherboard connecting terminal 45 is positioned inwardly from the surface 21a of the resin insulation layer 21. In addition, the solder resist 38 extends into the opening 37 formed in the outermost resin insulation layer 21 and makes contact with the outer circumference portion of the terminal outer surface 45a, so that the outer circumference portion of the terminal outer surface 45a is pressed in a so-called board thickness direction. Therefore, the motherboard connecting terminal 45 is reliably fixed to the outermost resin insulation layer 21, and a gap is not generated between the solder resist 38 and the outer circumference portion of the terminal outer surface 45a. In addition, it is possible to sufficiently increase adherence strength of the motherboard connecting terminal 45. In addition, since the adherence area of the solder resist 38 for the terminal outer surface 45a or the resin insulation layer 21 increases, it is possible to increase the strength of the multilayered wiring board 10.

(2) In the multilayered wiring board 10 according to the present embodiment, the terminal outer surface 45a of the motherboard connecting terminal 45 does not extend to the solder resist 38, but is embedded or buried in the resin insulation layer 21 having a high insulation property. In addition, the conductor layer 26 existing at the interface between the solder resist 38 and the resin insulation layer 21 is also embedded or buried in the resin insulation layer 21. In this manner, the resin insulation layer 21 having a high insulation property is interposed between the conductor layer 26 and the motherboard connecting terminal 45, and generation of migration can be reliably prevented. As a result, the conductor layer 26 or the motherboard connecting terminal 45 can be prepared with a relatively narrow pitch, and the multilayered wiring board 10 can be highly integrated. In addition, the protrusion 21c is interposed between the motherboard connecting terminal 45 and the wiring pattern conductor portion 26c. The protrusion 21c as a part of the outermost resin insulation layer 21 is protruded into the solder resist 38 further than the motherboard connecting terminal 45 and the wiring pattern conductor portion 26c. Therefore, since an insulation length between the motherboard connecting terminal 45 and the wiring pattern conductor portion 26c increases, it is possible to suppress generation of migration therebetween. Therefore, this contributes to high integration of the multilayered wiring board 10.

(3) In the multilayered wiring board 10 according to the present embodiment, the plating layer 48 is formed in the center portion on the terminal outer surface 45a, and the plating layer 48 does not exist in the interface with the solder resist 38 in the outer circumference portion of the terminal outer surface 45a making contact with the solder resist 38. In this case, it is possible to address a problem that gold in the plating layer 48 is diffused to the melted solder thus forming a gap at the interface between the terminal outer surface 45a and the solder resist 38. As a result, even after the solder is formed in the motherboard connecting terminal 45, it is possible to allow the terminal outer surface 45a and the solder resist 38 to reliably abut on each other and obtain sufficient adherence strength of the motherboard connecting terminal 45.

(4) In the multilayered wiring board 10 according to the present embodiment, the boundary portion between the solder resist 38 or the resin insulation layer 21 made of a resin material and the motherboard connecting terminal 45 made of a metal material has a non-rectilinear figure rather than a rectilinear figure. Therefore, it is possible to disperse the stress applied to the boundary portion and prevent cracks in the resin insulation layer 21.

In addition, the present embodiment may be modified as follows.

While the solder resist 38 is provided in the lower surface 32 side of the multilayered wiring board 10 according to the aforementioned embodiment, the solder resist 38 may be provided on the upper surface 31 side. In this case, the multilayered wiring board is formed such that the solder resist 38 extends into the opening 35 to make contact with the outer circumference portion of the terminal outer surface 41*a* of the IC chip connecting terminal 41, and the solder resist 38 is inserted into the opening 36 to make contact with the outer circumference portion of the terminal outer surface 42*a* of the condenser connecting terminal 42. If the multilayered wiring board is formed in this manner, it is possible to sufficiently increase adherence strength of the IC chip connecting terminal 41 and the condenser connecting terminal 42.

While the solder resist 38 is formed of a cured material of a resin insulation material having photo-curability as a main characteristic in the multilayered wiring board 10 according to the aforementioned embodiment, the present invention is not limited thereto. Any other material may be used if it is a heat-resistant coating material.

Figure 16:
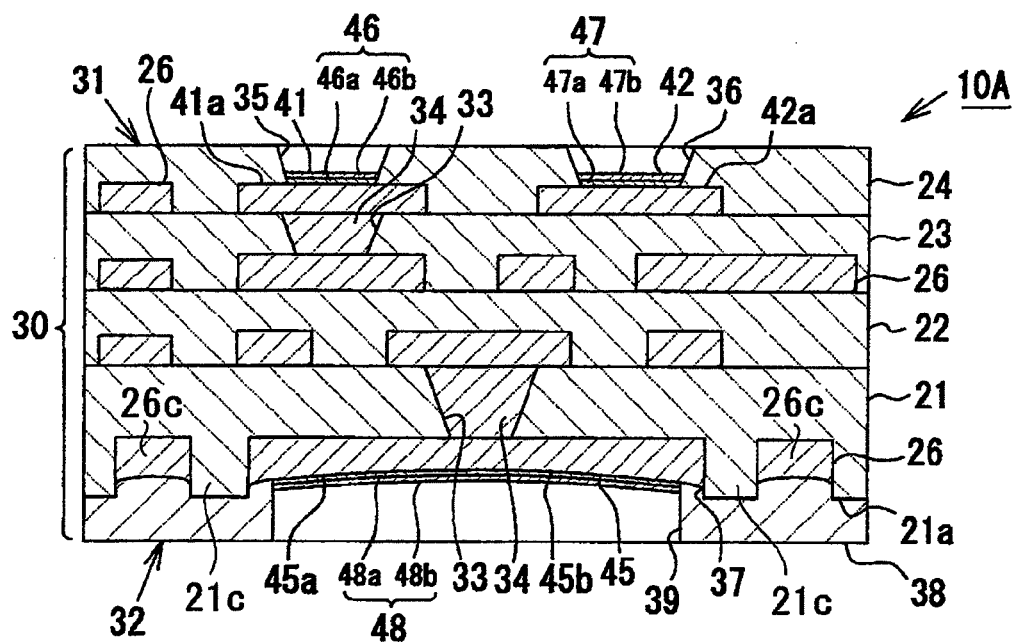
FIG. 16 is an enlarged cross-sectional view illustrating a schematic configuration of a multilayered wiring board according to another embodiment.
Figure 17:
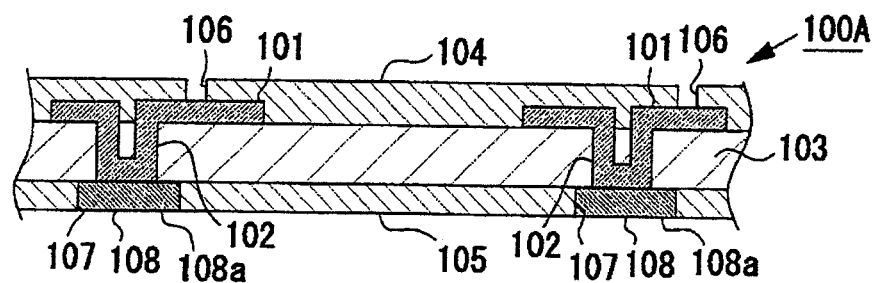
FIG. 17 is a cross-sectional view illustrating a wiring board of the related art.
Figure 18:
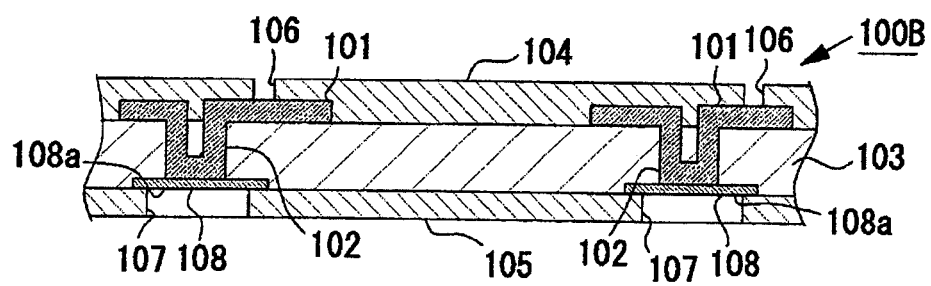
FIG. 18 is a cross-sectional view illustrating a wiring board of the related art.
Figure 19:
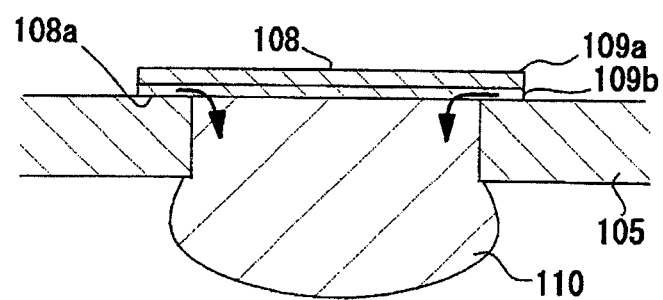
FIG. 19 is an enlarged cross-sectional view illustrating a wiring board of the related art.

While the terminal outer surface 45*a* of the motherboard connecting terminal 45 is flat in the multilayered wiring board 10 according to the aforementioned embodiment, the present invention is not limited thereto. As in the multilayered wiring board 10A shown in FIG. 16, a concavely rounded portion 45*b* may be formed such that a center portion of the terminal outer surface 45*a* of the motherboard connecting terminal 45 is positioned inwardly from the outer circumference portion. The rounded portion 45*b* in the terminal outer surface 45*a* is formed by more efficiently etching and removing the center portion than the end side of the metal conductor portion 58 when the etching is performed for a part of the metal conductor portion 58 in the process of forming the connecting terminal. In addition, roundness of the rounded portion 45 in the terminal outer surface 45*a* may be controlled by changing etching conditions such as etchant, humidity, or etching time. If the motherboard connecting terminal 45 is formed in this manner, the adherence area of the solder resist 38 increases. Therefore, it is possible to increase the adherence property with the solder resist 38. In addition, since the outer circumference portion of the terminal outer surface 45*a* making contact with the solder resist 38 becomes thicker than the center portion, it is possible to sufficiently increase strength of the terminal.

While a plurality of conductor layers 26 formed in a plurality of resin insulation layers 21 to 24 are connected to each other through a via conductor 34 tapered such that a diameter is widened from the lower surface 32 side to the upper side 31 side according to the aforementioned embodiment, the present invention is not limited thereto. The via conductor 34 formed in a plurality of resin insulation layers 21 to 24 may have a shape tapered in the same direction, and a plurality of conductor layers 26 may be connected to each other through a via conductor tapered such that a diameter is widened from the upper surface 31 side to the lower surface 32 side.

While the plating layers 46, 47, and 48 coated on each connecting terminal 41, 42, and 45 are the nickel-gold plating layer according to the aforementioned embodiment, a plating layer made of materials other than copper may be used. For example, the plating layers 46, 47, and 48 may be modified into other plating layers such as a nickel-palladium-gold plating layer.

What is claimed is:

1. A multilayered wiring board having a stack structure multilayered by alternately stacking a plurality of conductor layers and a plurality of resin insulation layers including a same resin insulation material as a primary component, a plurality of first main surface side connecting terminals arranged in a first main surface side of the stack structure, a plurality of second main surface side connecting terminals arranged in a second main surface side of the stack structure, the plurality of conductor layers formed in the plurality of resin insulation layers and operably connected to each other through via conductors tapered such that diameters thereof are widened toward the first main surface side or the second main surface side,
   wherein a solder resist is provided on at least one of the first main surface side and the second main surface side of the stack structure,
   a plurality of openings are formed in an outermost resin insulation layer that contacts with the solder resist, the plurality of the first main surface side connecting terminals or the plurality of the second main surface side connecting terminals being made of a copper layer as a main component and positioned in the plurality of the openings, connecting terminal outer surfaces being positioned inwardly from an outer surface of the outermost resin insulation layer, and the solder resist extends into the plurality of openings and makes contact with an outer circumference portion of each of the terminal outer surfaces.

2. The multilayered wiring board according to claim 1, wherein
   a concavely rounded portion is formed in the terminal outer surface such that a center portion is inwardly positioned from an outer circumference portion.

3. The multilayered wiring board according to claim 1, wherein
   the conductor layer, which is located in an interface between the solder resist and the outermost resin insulation layer, includes an interface conductor portion which is embedded in the outermost resin insulation layer.

4. The multilayered wiring board according to claim 1, wherein the conductor layer, which is located in an interface between the solder resist and the outermost resin insulation layer, includes a wiring pattern conductor portion adjacent to the plurality of first main surface side connecting terminals or the plurality of second main surface side connecting terminals, and the outermost resin insulation layer between the plurality of the first or second main surface side connecting terminals and the wiring pattern conductor portion is protruded into the solder resist further than a plurality of the first or second main surface side connecting terminals and the wiring pattern conductor portion.

5. The multilayered wiring board according to claim 1, wherein
   openings provided in the solder resist each have a diameter smaller than that of the plurality of opening provided in the outermost resin insulation layer, and a plating layer made of one or more kinds of metal other than copper is formed in a center portion of the terminal outer surface arranged in the opening provided in the solder resist.

6. The multilayered wiring board according to claim 1, wherein
   the solder resist is arranged on the second main surface side of the stack structure, and a plurality of motherboard connecting terminals to be connected to a motherboard are the plurality of the second main surface side connecting terminals.

7. The multilayered wiring board according to claim 1, wherein the via conductors are tapered such that the diameter thereof are widened from the second main surface side to the first main surface side.

8. A method of manufacturing a multilayered wiring board having a stack structure multilayered by alternately stacking a plurality of conductor layers and a plurality of resin insulation layers including a same resin insulation material as a main component, a plurality of first main surface side connecting terminals being arranged in a first main surface side of the stack structure, a plurality of second main surface side connecting terminals being arranged in a second main surface side of the stack structure, the plurality of conductor layers being formed in the plurality of resin insulation layers and connected to each other through via conductors tapered such that diameters thereof are widened toward the first main surface side or the second main surface side, the method comprising:

a process of forming a metal conductor portion corresponding to the first main surface side connecting terminal or the second main surface side connecting terminal on a base material;

a build-up process of forming, after the process of forming the metal conductor portion, a stack structure multilayered by alternately stacking the plurality of conductor layers and the plurality of resin insulation layers;

a process of forming, after the build-up process, connecting terminals including a plurality of the first main surface side connecting terminals and a plurality of the second main surface side connecting terminals within a plurality of openings in an outermost resin insulation layer by removing the base material while a part of the metal conductor portion remains; and a process of forming, after the process of forming connecting terminals, a solder resist on the outermost resin insulation layer, a part of the solder resist extending into the plurality of the openings and making contact with an outer circumference portion of outer surfaces of the connecting terminals.

9. The method of manufacturing a multilayered wiring board according to claim 8, wherein in the process of forming the metal conductor portion, a metal foil is stacked in a removable state on the base material, and a metal conductor portion is formed on the metal foil, wherein a process of removing the base material is performed to expose the metal foil by removing the base material after the build-up process, and wherein in the process of forming connecting terminals, a plurality of the first main surface side connecting terminals or a plurality of the second main surface side connecting terminals are formed by etching and removing the metal foil in the stack structure.

* * * * *